(12) United States Patent
Gottfried

(10) Patent No.: US 6,946,313 B2
(45) Date of Patent: Sep. 20, 2005

(54) METHOD OF MAKING AN ALIGNED ELECTRODE ON A SEMICONDUCTOR STRUCTURE

(75) Inventor: Mark Gottfried, Manville, NJ (US)

(73) Assignee: Emcore Corporation, Somerset, NJ (US)

( * ) Notice: Subject to any disclaimer, the term of this patent is extended or adjusted under 35 U.S.C. 154(b) by 0 days.

(21) Appl. No.: 10/798,770

(22) Filed: Mar. 12, 2004

(65) Prior Publication Data

US 2004/0171245 A1 Sep. 2, 2004

Related U.S. Application Data

(62) Division of application No. 09/976,342, filed on Oct. 12, 2001, now Pat. No. 6,727,167.
(60) Provisional application No. 60/240,207, filed on Oct. 13, 2000.

(51) Int. Cl.[7] .......................... H01L 21/00; H01L 21/28
(52) U.S. Cl. .......................................... 438/39; 438/605
(58) Field of Search .............................. 438/602, 603, 438/604, 605, 606, 39, 98

(56) References Cited

U.S. PATENT DOCUMENTS

| | | | | |
|---|---|---|---|---|
| 5,063,174 A | * | 11/1991 | Beyea et al. | 438/605 |
| 5,652,434 A | * | 7/1997 | Nakamura et al. | 257/13 |
| 5,696,389 A | * | 12/1997 | Ishikawa et al. | 257/99 |
| 5,700,713 A | * | 12/1997 | Yamazaki et al. | 438/25 |
| 5,739,552 A | * | 4/1998 | Kimura et al. | 257/89 |
| 5,814,533 A | * | 9/1998 | Shakuda | 438/46 |
| 6,008,539 A | * | 12/1999 | Shibata et al. | 257/745 |
| 6,023,076 A | * | 2/2000 | Shibata | 257/94 |
| 6,121,127 A | * | 9/2000 | Shibata et al. | 438/604 |
| 6,191,436 B1 | * | 2/2001 | Shibata et al. | 257/91 |
| 6,531,383 B1 | * | 3/2003 | Lee | 438/604 |
| 6,577,006 B1 | * | 6/2003 | Oota et al. | 257/745 |
| 2001/0055871 A1 | * | 12/2001 | Takeya et al. | 438/604 |

* cited by examiner

*Primary Examiner*—Olik Chaudhuri
*Assistant Examiner*—Lex H. Malsawma

(57) ABSTRACT

A method of making an electrode on a semiconductor device including depositing metal on a top surface of a semiconductor structure, and defining a first region of the semiconductor structure for a first electrode by forming a mask over the metal. The mask has an opening so that the first region is covered by the mask and a second region of the structure is aligned with the opening in the mask. Metal aligned with the opening in the mask in the second region is then removed to form a first electrode overlying the first region of the semiconductor structure, and also revealing the top surface of the semiconductor structure in the second region. Material is then removed from the semiconductor structure aligned with opening in the second region to form a second electrode surface for a second electrode.

15 Claims, 6 Drawing Sheets

METHOD OF MAKING AN ALIGNED ELECTRODE ON A SEMICONDUCTOR STRUCTURE

CROSS REFERENCE TO RELATED APPLICATIONS

This application is a Div. of 09/976,342 filed Oct. 12, 2001 now U.S. Pat. No. 6,727,167.

This application claims benefit of U.S. Provisional Application No. 60/240,207, filed Oct. 13, 2000, the disclosure of which is hereby incorporated by reference herein.

FIELD OF THE INVENTION

The present invention relates to optoelectronic devices, electrodes for introducing current to optoelectronic devices, and methods of making optoelectronic devices and electrodes for the same.

BACKGROUND OF THE INVENTION

Optoelectronic devices typically include a semiconductor structure arranged for generating light when, a current is introduced through the structure. Optoelectronic devices typically have semiconductor structures incorporating thin layers of semiconductor materials exhibiting opposite conductivity types, referred to as p-type conductivity and n-type conductivity. The p-type and n-type semiconductor layers are typically disposed in a stack, one above the other so as, to form a junction with one another. In certain structures, the p-type layer is disposed at the top of the stack of semiconductor layers and the n-type layer is disposed at the bottom of the stack. As used herein, references to the top or bottom of any feature are to be taken with reference to the device itself, as opposed to any gravitational frame of reference, as the devices disclosed herein could be oriented in any direction. The junction between the p-type and n-type material may include directly abutting p-type and n-type layers, or may include one or more intermediate layers which may be of any conductivity type or which may have no distinct conductivity type. The junction may also include other structures.

Light is generated at the junction when an electric current is introduced to the structure. As used in this disclosure, the term "light" includes radiation in the infrared and ultraviolet wavelength range, as well as the visible range. The wavelength of the light depends on factors including the composition of the semiconductor materials and the structure of the junction. One electrode is mounted on the p-type layer and another electrode is mounted near or on the n-type layer so as to introduce a current through those layers and through the junction. The materials in the electrode are selected to form low-resistance interfaces with the semiconductor materials. The electrodes may include pads for forming connections with other conductors for carrying current from external sources. The term "electrode-pad unit" as used in this disclosure refers to the electrode and the pad, whether the pad is a separate structure or formed as part of the electrode, or comprises a region of the electrode.

Certain structures incorporate current-spreading electrodes. Current-spreading electrodes make broad contact with the semiconductor structure and cover a significant portion of the top surface of the stack. Such electrodes, spread the current delivered to the top surface of the stack so that the effects of so-called. "current bunching" or "current crowding" are reduced. Current bunching is the tendency for current to travel straight through the semiconductor structure in a downward direction. Current is concentrated in that portion of the junction beneath the electrode. The light is generated in only the region accessed by the current. Where the electrode covers only a relatively small portion of the top surface of the stack, the amount of useful light reaching the outside of the optoelectronic structure per unit of electrical current passing through the structure, commonly referred to the external quantum efficiency of the structure, is reduced by current bunching. Thus, it is desirable to spread the current introduced to the semiconductor structure. In certain devices, a current-spreading electrode is often placed on a major surface of the device. Conductive materials utilized for electrodes in many contexts typically comprise metals that are opaque to light. Since a current-spreading electrode covers a major surface of the structure, the light generated by the structure does not pass through this surface if an opaque metal electrode is used. In certain applications, it is desirable to utilize a transparent electrode, so that the light can pass through the transparent electrode.

Certain optoelectronic devices, such as light-emitting diodes (LEDs), are formed with a region of the semiconductor structure removed so that an upwardly facing lower region is formed and an upwardly protruding region, referred to as a mesa, is formed. The top of the mesa typically comprises the top of a p-type semiconductor material on which a top electrode is disposed. A lower electrode is formed on the lower region, near the n-type layer. This structure is typically formed on a substrate or is otherwise mounted to a substrate or other support beneath the n-type layer so that light is directed out the top of the structure. Reflectors may be included in the support or within the semiconductor structure itself to direct light upwardly. In these structures, it is desirable that the top electrode is comprised of a substantially transparent material so that at least a portion of the light emitted by the LED shines out the top of the structure, in addition to the sides. It is preferred that the top electrode is as transparent to the light generated as possible.

In forming an optoelectronic device having a mesa, the mesa is typically formed first and then the p-type electrode is formed on the mesa. A first resist is applied to the structure and photolithographically patterned to form openings over certain regions of the structure. After patterning, the first resist remains on those regions of the wafer corresponding to the areas where mesas are to be formed. The regions of the semiconductor structure that are aligned with the openings in the first resist are removed by etching. The regions covered by the resist remain as mesas, which protrude from the structure. The first resist is stripped and a second resist is applied to the structure, and patterned to form openings for the p-type electrodes on the top of the mesas. Metal is then deposited in these openings. The metal deposited on the top of the mesa may be comprised of one or more metals that are selected to form a transparent electrode, upon subsequent annealing of the metals.

The inventors have, found that the foregoing process interferes with the optimum development of a transparent electrode. Without committing to any theory of operation, it is believed that the use of the resist layers on the top of the semiconductor structure interferes with achieving transparency after annealing. In addition, the second resist must be carefully registered with the mesas to avoid malformed p-type electrodes. If an opening in the second resist extends over an edge of a mesa due to misregistration, the resulting top electrode will contact the lower electrode on the lower region, thus shorting out the device. It is preferred that the top electrode is as transparent to the light generated as possible. It is also desirable to form the top electrode so that the edges of the electrode are spaced from the edges of the mesa, also to avoid shorting out the device.

Improvements in the methods of forming electrodes on semiconductor structures to address the foregoing issues are desirable.

SUMMARY OF THE INVENTION

The present invention addresses these needs

The method of making an electrode on a semiconductor structure comprises depositing metal on a surface of a semiconductor structure and forming a patterned mask over the metal on the semiconductor structure. The mask has at least one opening so that a first region is covered by the mask and a second region aligned with the at least one opening in the mask is left uncovered by the mask. The method also includes removing metal aligned with the at least one opening of the mask in the second region so as to reveal the surface of the semiconductor structure in the second region., and removing material from the semiconductor structure aligned with the at least one opening in the second region. Thus, the same mask is utilized in forming the electrode on the semiconductor structure and also used in removing material from the semiconductor structure. In removing material from the semiconductor structure, an upwardly protruding,.portion of the semiconductor structure is formed. The major surface of the protruding portion has metal for an electrode disposed thereon. Methods according to embodiments of the invention avoid the extra step of utilizing a separate mask in depositing metal on the structure. In addition, methods according to embodiments of the invention can be used to form an electrode registered with the upwardly protruding portion and spaced from the edge thereof. The registration of the metal on the upwardly-protruding portion of the structure can avoid shorting of the device comprising the semiconductor structure.

In certain preferred embodiments, the metal comprises a first metal and a second metal. The method may include annealing the first metal and the second metal. The first metal and second metal are desirably selected to form a substantially transparent material upon annealing. In certain preferred embodiments, the first metal comprises nickel and the second metal comprises gold. The step of depositing the metal may comprise electron beam deposition. The first metal and second metal may be deposited as separate layers by depositing a first metal and then depositing a second metal overlying the first metal. Thus, an electrode may be formed on top of the upwardly protruding portion of the semiconductor structure and the electrode may be comprised of one or more metals or layers of one or more metals.

In certain embodiments, the step of forming a patterned mask comprises applying a resist on the deposited metal and lithographically patterning the resist to form openings over the second region. The remaining resist overlies the semiconductor structure in the first region.

Desirably, the steps of removing metal and removing material from the semiconductor structure comprise etching. The step of removing metal may comprise, for example, etching with a KI:I2:DI solution. The step of removing material from the semiconductor structure desirably comprises etching the semiconductor structure while the resist remains over the semiconductor structure in the first region. The step of removing material from the semiconductor structure desirably comprises a reactive ion etching ("RIE"). The step of etching may also comprise etching with BCl3.

The resist layer covering the first region may have edges and the step of removing metal may be performed so as to remove some of the metal underneath the resist layer, adjacent the edges of the resist layer, to form a space between the edges of the resist layer and the metal on the semiconductor structure. The metal in the first region preferably substantially covers the first region, except in the space between the edges of the resist layer and the metal. Thus, the metal in the first region is spaced from the edges of the resist layer. When the upwardly protruding portion of the semiconductor structure is formed, the resist layer substantially protects the semiconductor structure in the first region, directly beneath the resist layer, and the portion of the semiconductor in the second region is removed. The metal in the first region is spaced from the edges of the protruding portion. Shorting of the device formed from the semiconductor structure is largely avoided where the metal is formed so that the metal is spaced from the edge of the protruding portion.

The step of removing material from the semiconductor structure in the second region is preferably performed so as to leave the first region protruding from the remainder of the semiconductor structure. The semiconductor structure comprises a p-type semiconductor layer overlying an n-type semiconductor layer arranged beneath the p-type semiconductor layer. The semiconductor structure has a junction between the p-type and the n-type layer. Thus, when the upwardly protruding portion of the semiconductor structure is formed, the upwardly protruding portion comprises a portion of the p-type layer and a lower region is formed, which comprises a portion of the n-type layer. Desirably, when the upwardly protruding portion is formed, the metal covers a large portion of the semiconductor structure in the first region and the metal is in contact with the p-type layer.

The method also preferably includes forming a lower electrode on the n-type layer of the lower region.

In another aspect of the present invention, a method of making a transparent electrode for a light-emitting diode comprises depositing metal on a top surface of the semiconductor structure, defining a first region of the semiconductor structure for a first electrode by forming a mask over the metal. The mask has an opening so that the first region is covered by the mask and a second region is aligned with the opening of the mask. The method also comprises removing metal aligned with the opening of the mask in the second region, so as to reveal the top surface of the semiconductor structure in the second region, and removing material from the semiconductor structure aligned with the opening in the second region to form a second electrode surface for a second electrode. The second electrode surface is lower in elevation than the top surface of the semiconductor structure. In certain preferred embodiments, the method is utilized to form a light-emitting diode having an upwardly protruding mesa and the metal deposited forms a first electrode on the mesa.

The method may also comprise the step of depositing metal, including depositing a first metal and depositing a second metal. In certain preferred embodiments, the first metal and second metal are annealed. The first metal and second metal may be selected to form a substantially transparent material upon annealing. The first metal preferably comprises nickel and the second metal preferably comprises gold. The step of depositing may comprise electron beam deposition, for example. The step of depositing metal may comprise depositing a first metal and depositing a second metal overlying the first metal. Thus, the metal may be deposited as separate layers.

In certain preferred embodiments, the step of defining a first region comprises applying a resist on the metal and lithographically patterning the resist to form openings in the second region so that the remaining resist overlies the semiconductor structure in the first region.

The step of removing metal and the step of removing material from the semiconductor structure may comprise etching. The step of etching to remove metal may be performed with a KI:I2:DI solution. The step of removing material from the semiconductor structure desirably comprises etching the semiconductor structure while the resist remains in the first region. Etching the semiconductor structure may comprise reactive ion etching ("RIE"). Etching the semiconductor structure may also comprise etching with BCl3.

The resist layer in the first region may have edges and the step of removing metal may be performed so as remove some of the metal underneath the resist layer, adjacent the edges of the resist layer, to form a space between the edges of the resist layer and the metal on the semiconductor structure. The metal in the first region preferably substantially covers the first region, except in the space between the edges of the resist layer and the metal on the semiconductor structure. The step of removing material from the semiconductor structure may be performed so as to leave the first region protruding from the remainder of the semiconductor structure.

The semiconductor structure may comprise a p-type semiconductor layer overlying an n-type semiconductor layer arranged beneath the p-type semiconductor layer. The semiconductor structure may have a junction between the p-type layer and the n-type layer. The step of removing material from the semiconductor structure preferably forms an upwardly protruding portion of the p-type layer and a lower region, preferably comprising a portion of the n-type layer. Desirably, the first region forms the mesa of the light-emitting diode, and the metal forms an electrode on the mesa. The metal preferably covers a large portion of the semiconductor structure in the first region and is in contact with the p-type layer.

Preferably, the method further includes forming a lower electrode on the n-type layer of the lower region.

BRIEF DESCRIPTION OF THE DRAWINGS

These and other features, aspects, and advantages of the present invention will become better understood with regard to the following description, appended claims and accompanying drawings where:

FIG. 3 is the cross-sectional view of. FIG. 2, in the method in accordance with the embodiment of FIG. 2, at a later stage in the method;

DETAILED DESCRIPTION

Figure 1:
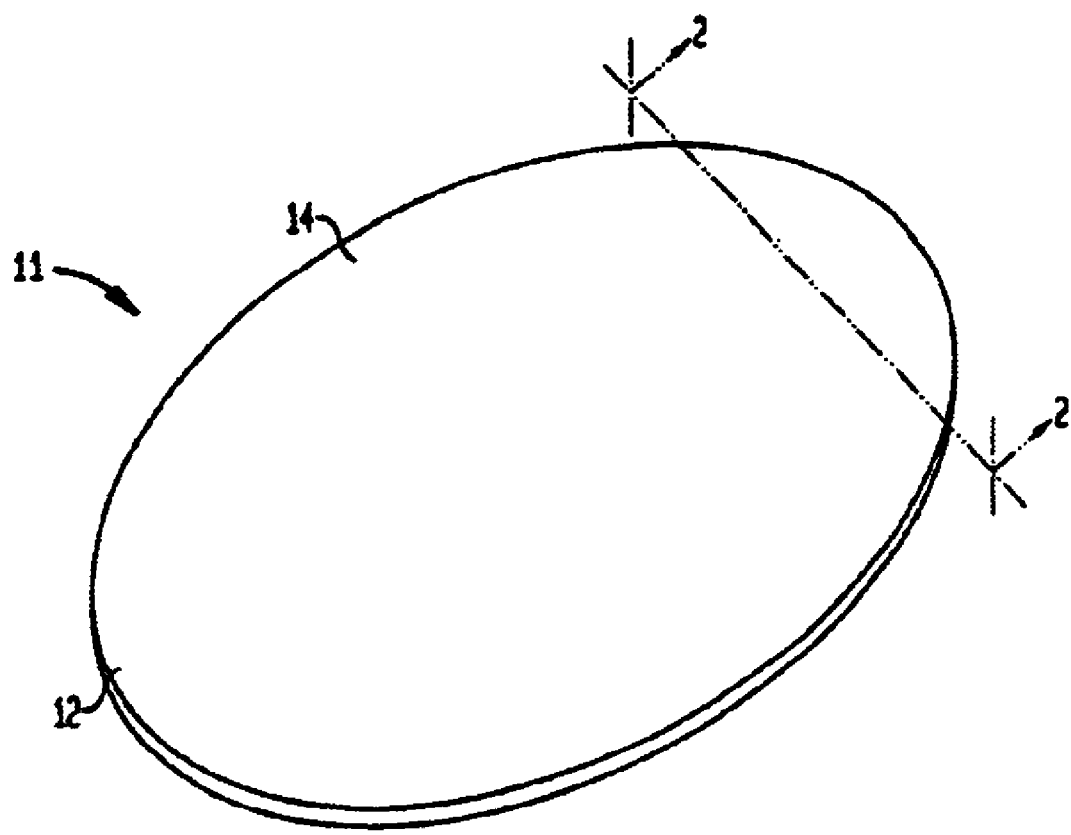
FIG. 1 is a top perspective view of a wafer used in a method in accordance with one embodiment of the invention.

A method in accordance with an embodiment of the invention is illustrated in FIGS. 1–11. In a first step, a semiconductor structure 11 for making an LED or any other optoelectronic device is provided. The semiconductor structure may comprise a wafer 12 for forming a plurality of LEDs, including p-type semiconductors, n-type semiconductors, and other semiconductor materials. The wafer, in certain, preferred embodiments, includes a p-type layer 16 overlying an n-type layer 17 so as to form a junction 19 therebetween. The junction 19 may comprise directly abutting p-type and n-type layers, or one or more intermediate layers between the p-type and n-type layers. The intermediate layers may have any conductivity type or no distinct conductivity type. Thus, the figures show the p-type layer, n-type layer and junction schematically. A person of ordinary skill in the art will appreciate that the semiconductor structure may incorporate various layers of semiconductor materials, as well as other structures used in the optoelectronic arts.

In one preferred embodiment, the wafer comprises Gallium-nitride based materials such as GaN, AlGaN, InGaN, and AlIn GaN. The materials are typically grown on an insulating substrate 21 such as sapphire or alumina by chemical vapor deposition. However, those of ordinary skill in the art will appreciate that a number of other semiconductor materials for forming other types of optoelectronic devices, including LEDs may be used. As used herein, "gallium nitride based semiconductor" refers to a nitride based semiconductor including gallium. In certain preferred embodiments, the semiconductor materials comprise gallium nitride based semiconductors. For example, GaN, AlGaN, InGaM and AlIn GaN are used to form LEDs emitting light in various wavelength ranges including blue and ultraviolet.

In the embodiment of FIGS. 1–11, the wafer 12 has a top surface 14 comprising the top surface of a p-type semiconductor material 16. Metal for forming a p-type electrode is deposited on the entire top surface 14 of the wafer typically by sputtering metal onto the top surface 14. The metal or metals are selected to make a good, desirably ohmic, electrical contact with the p-type semiconductor material 16. Methods for depositing metal for electrodes of optoelectronic devices are well known and the metal may be deposited utilizing a number of methods. For example, metal may be deposited utilizing electron beam deposition, sputter deposition, or plating.

Figure 2:
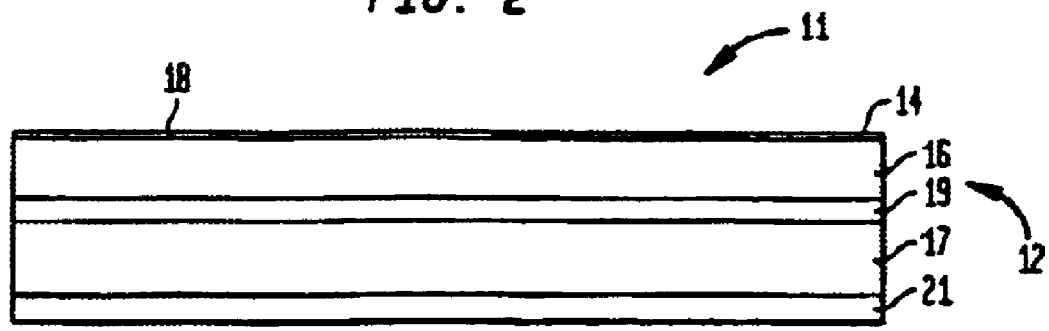
FIG. 2 is a cross-sectional view of the wafer at a later stage in the method, taken along line 2—2 in FIG. 1.
Figure 3:
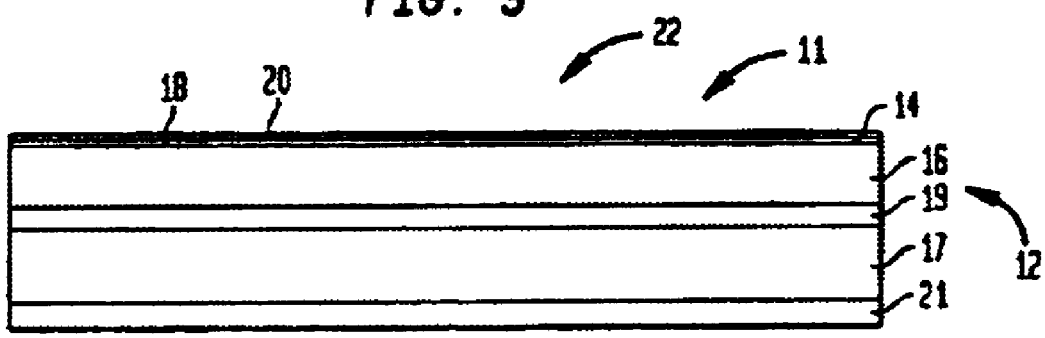

As shown in FIG. 2, a first metal 18 is deposited onto the top surface 14. A second metal 20 is deposited onto the first metal 18, as shown in FIG. 3. In certain preferred embodiments, the first and second metals are selected so as to form transparent contacts upon subsequent annealing of the first and second metals. In a preferred embodiment, first metal 18 comprises a 100-angstrom thick layer of nickel and second metal 20 comprises a 100-angstrom thick layer of gold. In other embodiments, the metals used will be different and/or the thicknesses of the deposited metal or metals will be different. Depositing more metal maybe more desirable to address current crowding, whereas depositing less metal maybe more desirable for a more transparent electrode. These metals will be annealed to form a transparent electrode, as disclosed below. However, the one or more metals may comprise metals for forming a good electrically conductive interface with the p-type layer, without forming a transparent electrode. The metal is deposited in an unpatterned manner, so that the metal covers the top surface 14 of wafer 12 to form a metal-covered structure 22, as shown in FIG. 3.

Figure 4:
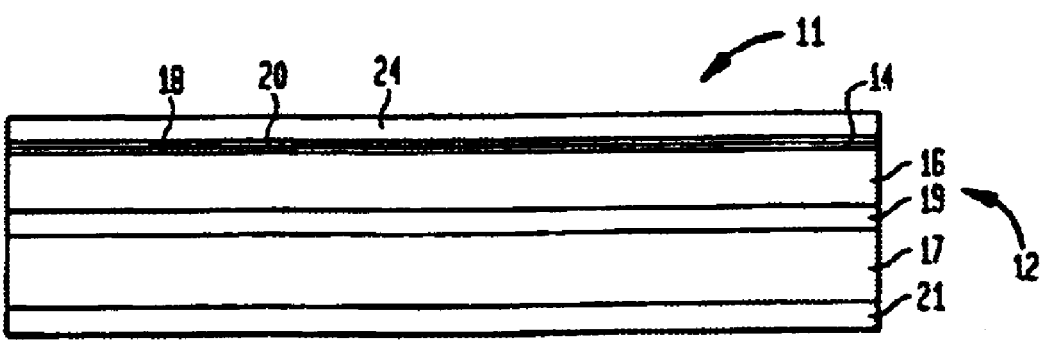
FIG. 4 is the cross-:sectional view of FIG. 3, at a later stage in the method.
Figure 5:
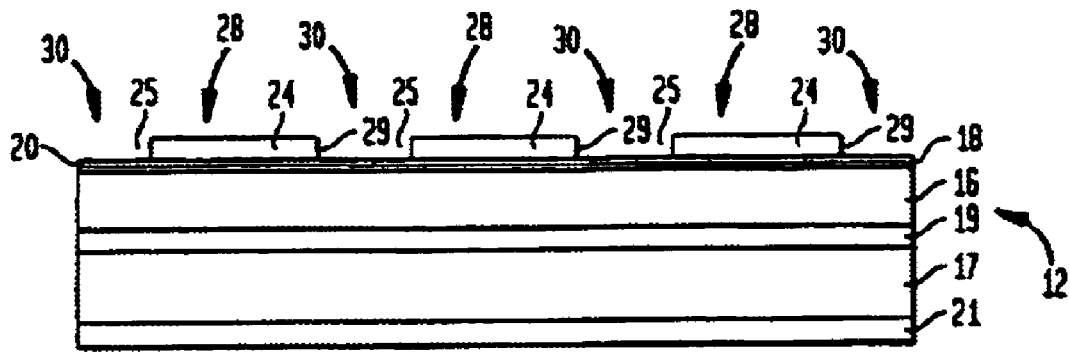
FIG. 5 is the cross-sectional view of FIG. 4, at a later stage in the method.
Figure 6:
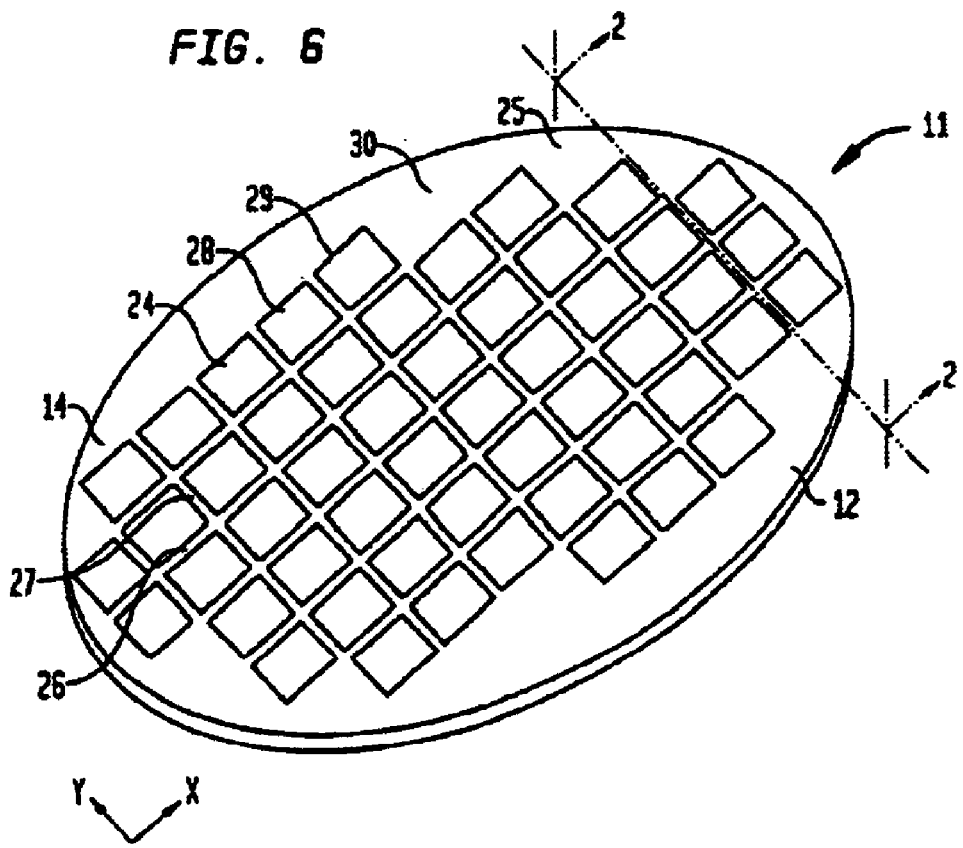
FIG. 6 is a top plan view of the wafer in a method according to the embodiment of FIGS. 1–5.

A resist layer 24 is deposited by spin coating resist on the second metal 20, so as to cover the top of the structure 22, as shown in FIG. 4. In a preferred embodiment, the resist is applied as a layer having a thickness greater than 3.5 microns. The resist layer 24 comprises a resist which is patternable utilizing lithographic techniques. These techniques include photolithography utilizing visible light, ultraviolet light, X-ray radiation and infrared light to pattern the resist. Other forms of energy may also be used, such as an electron beam. The light or other form of energy is directed at the layer of resist 24 through a mask having openings arranged in a pattern so that portions of the resist are exposed. The resist is developed, forming an opening 25 in the resist 24, as shown in FIGS. 5 and 6. Edges 29 of the resist form the perimeter of the opening. Thus, a series of first regions 28 of the semiconductor structure are covered by the resist 24 and a series of second regions 30 of the semiconductor structure are aligned with the opening 25 in the resist and left uncovered by the resist 24. As seen in FIG. 6, resist 24 that remains on the semiconductor structure 11 is surrounded by the opening 25 formed when the resist is developed. The opening 25 has X-channels 26 running in the X-direction on the wafer 12 and Y-channels 27 running in the Y-direction on the wafer. The X-channels and Y-channels connect with each other so as to form rectangular portions of resist 24 lying on the first and second metal. The resist 24 may have virtually any shape and the patterning of the resist may be performed so as to produce resist 24 having many different shapes, as well as an opening 25 or series of openings having various shapes. The resist 24 and the opening 25 form a mask for subsequent steps.

A plurality of devices will be formed from the wafer 12. Each device, such as an LED, has a first region 28 and at least one second region 30 associated with it. The resist 24 is patterned so that the second regions 30 comprise areas where semiconductor material will be removed to form a lower region for each device. The first regions 28 comprise areas which will protrude from the lower regions. Thus, the devices have a stepped shape. The opening 25 in the resist overlies the metal in the second regions 30, as shown in FIG. 5. The figures are not drawn to scale and a typical wafer includes many more LEDs than represented by the first and second regions in FIGS. 5 and 6. Although, the resist 24 covering the first regions 28 in FIG. 6 has the shape of a square in plan, a number of other shapes may be formed by selecting the pattern of the mask utilized in lithographic patterning. Thus, mesas and lower regions having virtually any geometric shape may be formed.

The metal in the second regions 30 is then etched to remove the metal in those regions. During etching, the metal in the first regions 28 is substantially protected from the etching process by the resist 24. In embodiments in which gold and nickel are utilized as the first metal 18 and second metal 20, the etchant preferably comprises $KI:I_2:DI$ solution which removes both the gold and nickel from the second region 30. For 100 angstrom thick layers of nickel and gold, the etching proceeds for 1 minute. After 1 minute has elapsed, the structure is rinsed with a liquid to stop the etching process.

Figure 7:
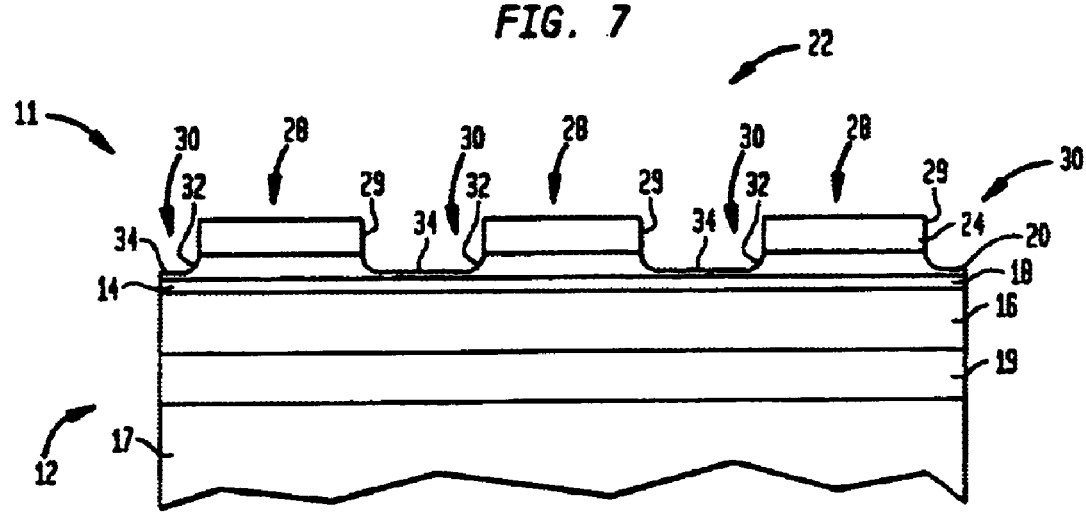
FIG. 7 is the cross-sectional view of FIG. 5, at a later stage in the method.
Figure 8:
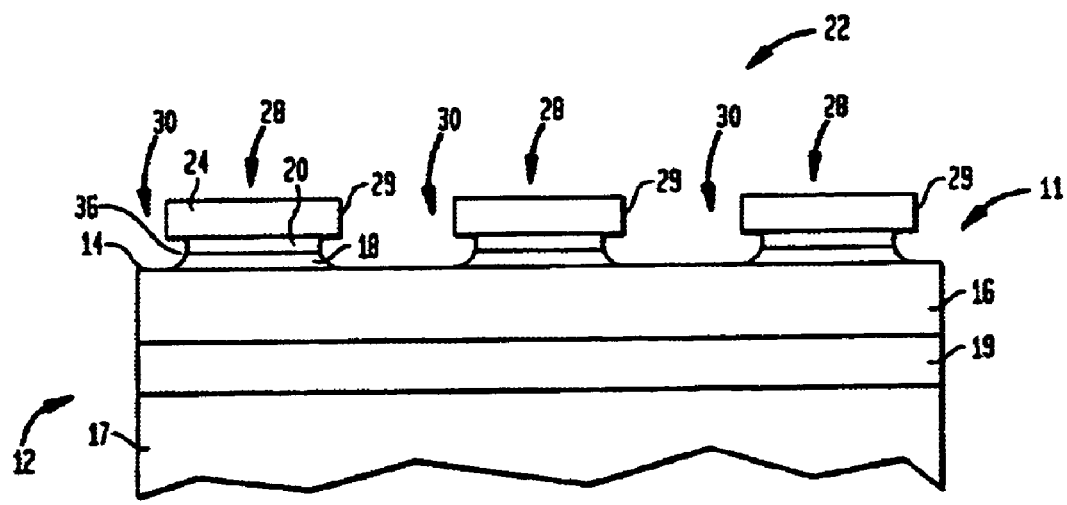
FIG. 8 is the cross-sectional view of FIG. 7, at a later stage in the method.

Although the metal in the first region 28 is substantially protected by the resist 24, the etching process is permitted to continue so as to undercut the metal underneath the resist 24. Etching typically occurs evenly across an exposed surface so that etching from a level, horizontal surface will occur generally downwardly. However, as etching proceeds around the resist 24, a sloped surface 32 in the metal develops, as shown in FIG. 7. The etchant tends to remove metal in a direction normal to the surface of the metal, i.e., from the sloped surface 32 adjacent the resist as well as the generally horizontal surface 34, well outside the resist. As the etchant removes metal from the surface 32, metal is removed underneath the resist 24, undercutting the resist. The etching process is arrested utilizing a rinse, which effectively removes the etchant from the metal. By arresting the etching process after a desired amount of undercutting has occurred, a space 36 is created underneath the resist, as shown in FIG. 8. Thus, the first metal 18 and second metal 20 are spaced from the edges of the resist. By experimentation, the size of this space 36 for a given etching time can be determined. Thus, an approximate, desired size for the space 36 may be achieved. For example, a space of approximately a few microns may be achieved by etching the 100 angstrom thick gold layer and 100 angstrom thick nickel layer for approximately 1 minute in $KI:I_2:DI$. The $KI:I_2:DI$ etchant removes gold at a rate of about 400 angstroms per minute.

After etching the metal, the semiconductor structure 11 is etched in the second regions 30. The semiconductor structure 11 is etched to remove a portion of the p-type semiconductor material 16 and a portion of the other layers of the semiconductor structure 1, including a portion of the n-type layer. Such etching forms a lower region 38 for each device to be formed from the wafer 12. The etching is carried out until enough semiconductor material has been removed so that the lower regions 38 are disposed beneath the junction 19 between the p-type layer 16 and n-type layer 17. The semiconductor structure 11 in the first regions 28, which are covered by resist 24, are substantially protected by the resist 24 and will remain as mesas 40 or protruding portions of the semiconductor structure. Each device to be formed has a protruding portion. The protruding portions, in some preferred embodiments, form the mesas for LEDs. In a preferred embodiments the semiconductor structure in the second regions 30 is etched in a dry etch process utilizing reactive ion. (RIE) etching. For example, RIE etching is performed on a semiconductor structure of gallium-nitride based materials for two and a half hours, forming a mesa having a height of about 8000 to 12000 angstroms. In another example, $BCl_3$ may be used for semiconductor structures having, layers of gallium nitride (GaN) and gallium nitride based semiconductors. Another dry etchant which may be used is $Cl_2$. In other embodiments of the invention, a wet etching solution or inductively coupled plasma ("ICP") may be utilized to remove material from the semiconductor structure to form the mesas 40.

Figure 9:
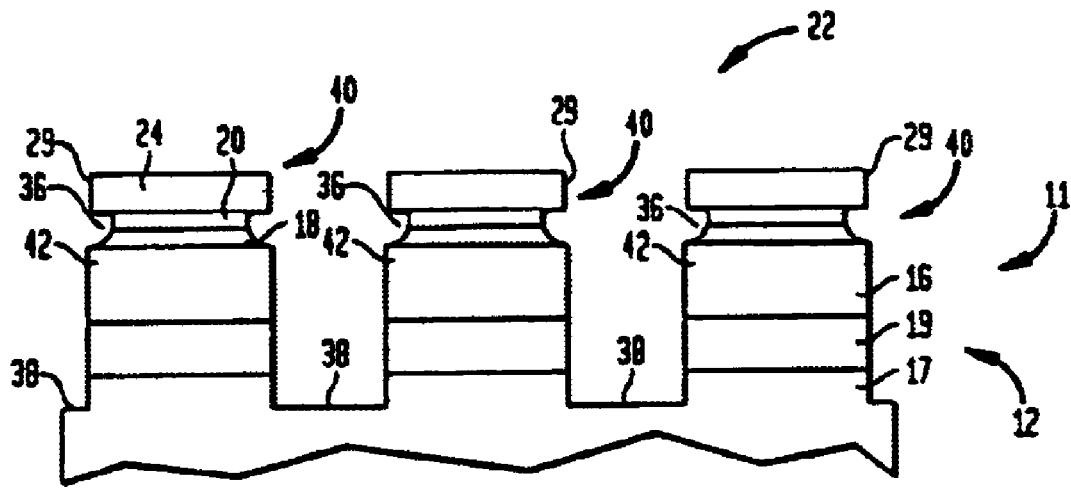
FIG. 9 is the cross-sectional view of FIG. 8, at a later stage in the method.

The resist 24 substantially protects the p-type semiconductor material 16 in the first regions 28, including the semiconductor material located inwardly of the edges 29 of the resist 24 that are no longer covered by the first metal 18 and second metal 20. Thus, the area of material 42 beneath the space 36 formed by etching the first metal 18 and second metal 20 is substantially protected by the resist 24. (See FIG. 9). As noted above, in some preferred embodiments the height of the mesas is 8000 to 12000 angstroms. The height of the mesas shown in FIG. 9 is exaggerated. It should be, appreciated that the figures are not drawn to scale. Typically, the semiconductor structure 11 is only on the order of about five microns thick and each LED die on the wafer 12 is on the order of a few hundred microns, for example, about 200–300 microns in length and width.

Figure 10:
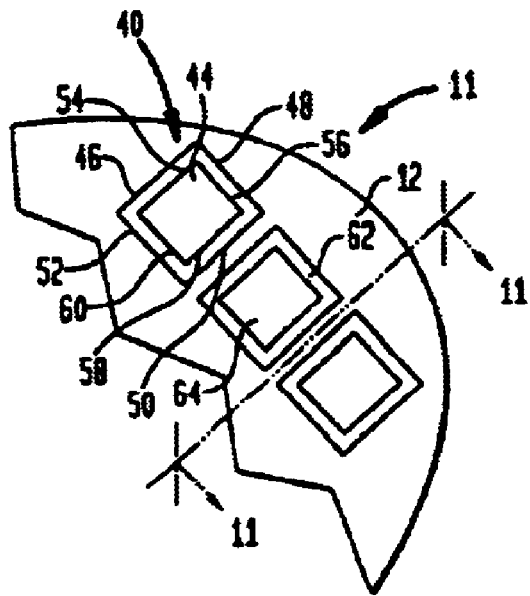
FIG. 10 is a partial, top plan view of a structure in accordance with the embodiment of FIGS. 1–9.

The resist 24 is stripped from the semiconductor structure 11. The mesas 40.each have edges that were aligned with the edges 29 of the resist 24. For example, square mesas 40 have edges 46, 48, 50 and 52, as shown in FIGS. 9 and 10. Metal layers 44 comprised of first metal 18 and second metal 20 overlie each mesa 40. Edges 54, 56, 58 and 60 of the metal layers 44 are spaced from the edges 46, 48, 50 and 52 of the mesa 40. The gap 62 between the edges 46, 48, 50 and 52 of the mesa 40 and the edges 54, 56, 58 and 60 of the metal layers 44 corresponds to the space 36. The dry etching process is controlled so as to leave the gap 62 of semiconductor material 16 around the metal layer 44. Etching to form the mesas also defines lower regions 38 surrounding the mesas. The lower regions 338 may comprise strip-like regions extending alongside mesas 40. The lower region 38 may be about 5 to about 100 microns wide.

After forming the mesas 40, a residue from the resist material used in forming the mask discussed above typically remains on the sidewalls or edges of the mesas 40. Preferably, the residue from the resist is removed from the semiconductor structure by rinsing the structure in a base solution for about a minute.

Figure 11:
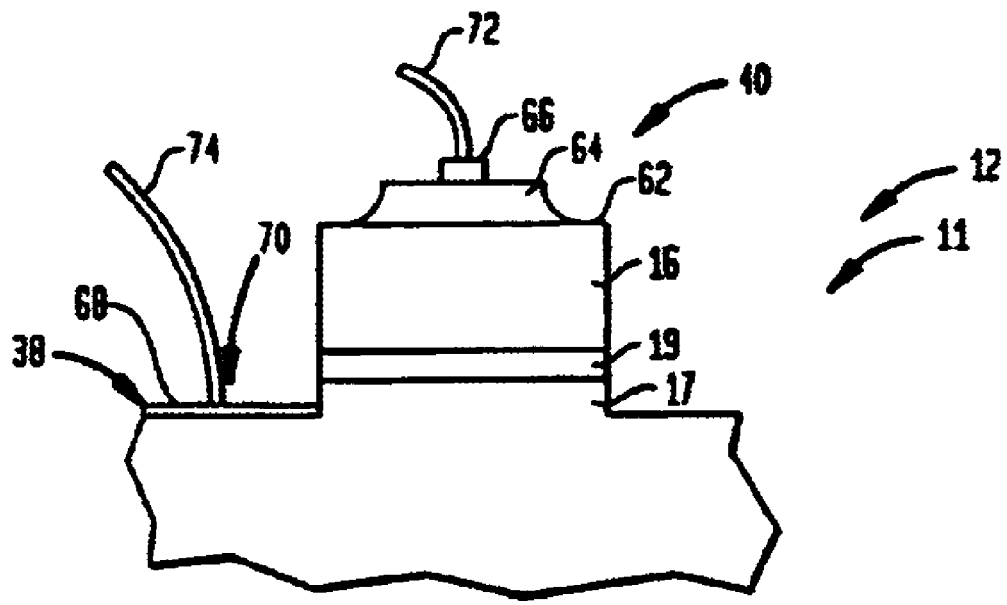
FIG. 11 is a cross-sectional view taken along line 11—11 in FIG. 10, at a later stage in the method.

After forming the mesas 40, the first metal 18 and second metal 20 are annealed in an oxidizing atmosphere at an elevated temperature, as required to provide ohmic contacts on the p-type layer 16 of the mesas. For example, the nickel and gold layers may be annealed at about 500–900° C. for about 5 minutes so as to oxidize the nickel to form a transparent top electrode 64 on top of the mesa 40, as shown in FIGS. 10 and 11.

Preferably, some structure is formed on the top electrode 64 to facilitate a connection between the device and an external power source. A top pad 66 is formed on the top surface of top electrode 64 at or near the horizontal center of each mesa 40, i.e., near the center of the square top surface of the mesa 40. The pad 66 and top electrode 64 form an electrode-pad unit. Pad 66 is formed from appropriate materials to provide a terminal which can be connected to an external lead in service as, for example, by wire bonding a lead to the pad. Other bonding and interconnection methods may be used. Wire bonding is a preferred method. The materials of the pad should also be compatible with the materials in top electrode 64. Merely by way of example, top pad 66 may include a layer of titanium overlying the transparent electrode; a layer of platinum overlying the titanium layer; and a layer of gold overlying the platinum layer. The exposed layer of gold provides a suitable surface for wire bonding. The top pad 66 typically has a diameter of about 100–120 microns. Desirably, this pad is as small as possible consistent with the requirements of the bonding operation used to connect the pad to external circuitry. The top pad 66 is typically comprised of opaque conductive materials. Thus, the top pad desirably occupies less than about 10 percent of the mesa top surface, especially in embodiments having transparent electrodes. (See FIG. 11).

Lower electrode-pad units are provided on the lower regions 38. On the lower region 38, the electrode 68 is formed from electrically conductive materials which make a good, desirably ohmic, electrical contact with the lower region 38. These materials can be deposited, for example, using a further resist (not shown) patterned to provide open areas aligned with the lower regions. For example, where the lower region 38 comprises an n-type gallium nitride based semiconductor, the lower electrodes may be formed from layers including aluminum and titanium which are annealed at an elevated temperature. This annealing may occur during the same annealing step used to form the top electrode 64. A pad region 70 of electrode 68 may comprise part of the electrode 68 and include the same layers of aluminum and titanium. (See FIG. 11). The pad region also preferably, includes layers adapted for bonding to external leads or other structures. For example, the lower electrode 68 may include a layer of platinum over the titanium and aluminum layers for the lower electrode 68, and a layer of gold over the platinum layer. The gold layer provides a good bonding surface. In a particularly preferred arrangement for use with gallium nitride-based semiconductors, the entire lower electrode-pad unit, including pad region 70 and lower electrode 68 is formed from layers of aluminum, titanium, platinum and gold, deposited in that order and then annealed. In certain preferred embodiments, a 200 angstrom thick layer of aluminum is deposited on lower region 38, followed by 400 angstroms of titanium, 500 angstroms of platinum, and 6000 angstroms of gold.

The wafer is then cut to form individual dies, each having a mesa 40 and a lower region 38. The entire stacked structure of each die, apart from lower pad 70 and top pad. 66 may be covered by a transparent, electrically insulating material such as a silicon oxide (not shown) to protect the device. The insulating material may be applied before the individual dies are separated, or before the lower electrode-pad units are formed.

In use, the top pad 66 and lower pad 70 are connected by wire bonds 72 and 74 to an external electrical power source. Current flows between pads 66 and 70 through the electrodes and through the structure 11, so that light is emitted at the junction 19. Preferably, the lower electrode 68 surrounds the mesa 40 to promote uniform distribution of the current through the horizontal extent of the junction.

Figure 12:
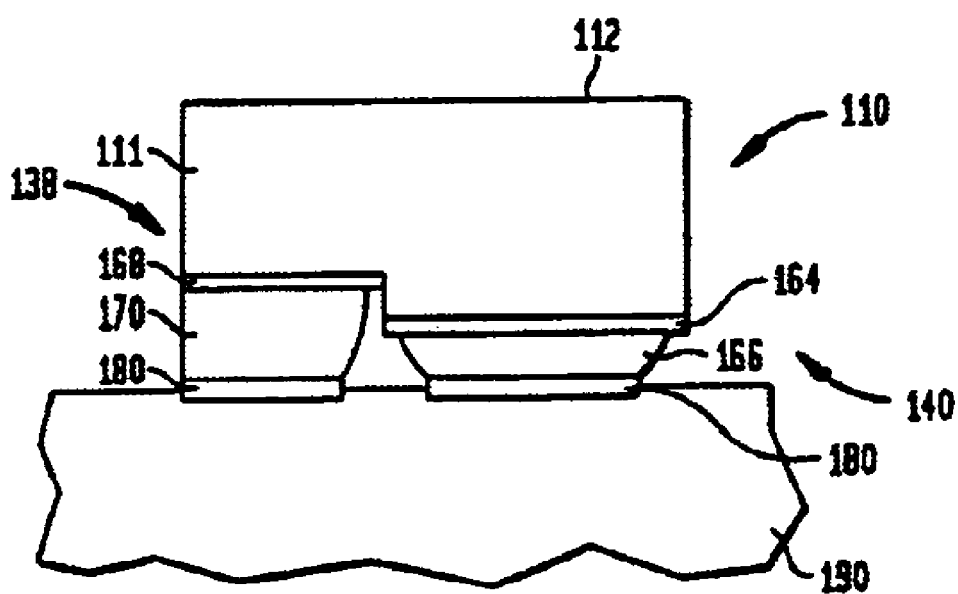
FIG. 12 is a cross-sectional view of a structure in accordance with another embodiment of the invention.

A method in accordance with the present invention may be used to form transparent, electrodes as discussed above. However, a method in accordance with the present invention may also be used to form non-transparent electrodes. One example of a structure utilizing a non-transparent electrode is shown in FIG. 12. The die 110 has a substantially transparent back face 112 through which light will be directed. The die 110 is a semiconductor structure 111 comprising a stacked structure of p-type, n-type and other semiconductor materials for generating light. The structure 111 has a mesa 140 protruding from the structure 111 and a lower region 138. A first electrode 164 is mounted on the mesa 140 and has a first pad 166. A second electrode 168 is mounted on the lower region 138 and has a second pad 170. The first pad 166 and second pad 170 are connected to contacts 180 on a substrate 190. The first pad 166 and second pad 170 may comprise, for example, a bonding material disposed between the electrodes and contacts. Thus, light generated by this device is directed out the back face 112 and a transparent electrode is not necessary. The metal which is deposited on the structure 111 to form electrode 164 need not be selected so as to form a transparent electrode upon subsequent annealing. The annealing step may or may not be performed depending on what is required to provide ohmic contacts.

In other embodiments of the invention, one metal or more than two metals may be deposited, or materials in addition to metal may be deposited, for example, oxides or other compounds. In certain embodiments, compounds are deposited which are transparent as deposited.

As these and other variations and combinations of the features discussed above can be utilized without departing from the present invention, the foregoing description of the preferred embodiments should be taken by sway of illustration rather than by way of limitation of the invention or inventions further described by the claims.

What is claimed is:

1. A method of forming electrodes on first and second respective regions of a semiconductor structure, comprising:
   a. depositing metal on a surface of a first region of the semiconductor structure;
   b. forming a patterned mask over the metal on the surface of the first region, the mask having an opening so that a first portion is covered by the mask and a second portion aligned with the opening is left uncovered by the mask by applying a resist on the metal to form a resist layer, and lithographically patterning the resist layer to form the opening over the second region so that the remaining resist layer overlies the semiconductor structure in the first region;
   c. removing metal aligned with the opening in the second portion thereby defining a first electrode overlying and making electrical contact with the first region of the semiconductor structure;
   d. removing material of the semiconductor structure aligned with the opening in the second portion to expose a surface of the second region of the semiconductor structure by etching the semiconductor structure while the resist layer remains over the semiconductor structure in the first region; and
   e. forming a second electrode making electrical contact with the second region of the semiconductor structure.

2. The method of claim 1, wherein the step of depositing metal comprises depositing a first metal and subsequently depositing a second metal over the first metal.

3. The method of claim 2, wherein the first metal comprises nickel and the second metal comprises gold, and further comprising annealing the structure so that the metal layers form a substantially transparent material.

4. The method of claim 1, wherein the step of depositing comprises electron beam deposition.

5. The method of claim 1, wherein the step of removing metal comprises etching.

6. The method of claim 1, wherein the step of removing material by etching comprises etching with KI:I2:DI solution.

7. The method of claim 1, wherein the step of removing material from the semiconductor structure comprises a reactive ion etching.

8. The method of claim 1, wherein the step of removing material by etching comprises etching with $BCl_3$.

9. The method of claim 1, wherein the resist layer covering the first region has an edge circumscribing the opening and the step of removing metal removes some of the metal underneath the resist layer adjacent the edge of the resist layer to form a gap between the edge of the resist layer and the metal on the semiconductor structure.

10. The method of claim 9, wherein the metal in the first region substantially covers the first region except in said gap.

11. The method of claim 1, wherein the step of removing material from the semiconductor structure in the second region is performed so as to leave the first region protruding from the remainder of semiconductor structure.

12. The method of claim 11, wherein, after material is removed from the semiconductor structure in the second region, and upwardly protruding portion comprising the p-type layer and a lower region comprising a portion of the n-type layer are formed.

13. The method of claim 11, wherein the metal covers a large portion of the semiconductor structure in the first region, the metal being in contact with the p-type layer.

14. The method of claim 11, wherein the step of forming a second electrode includes depositing metal to make electrical contact with the n-type layer of the second region.

15. The method of claim 1, wherein the first region of the semiconductor structure includes a p-type semiconductor layer, and the second region includes an n-type semiconductor layer arranged beneath the p-type semiconductor layer, the semiconductor structure having a junction between the p-type layer and the n-type layer.

* * * * *